(12) United States Patent
Koike et al.

(10) Patent No.: US 6,855,620 B2
(45) Date of Patent: Feb. 15, 2005

(54) METHOD FOR FABRICATING GROUP III NITRIDE COMPOUND SEMICONDUCTOR SUBSTRATES AND SEMICONDUCTOR DEVICES

(75) Inventors: Masayoshi Koike, Aichi-ken (JP); Seiji Nagai, Aichi-ken (JP); Yuta Tezen, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/258,546
(22) PCT Filed: Mar. 2, 2001
(86) PCT No.: PCT/JP01/01663
§ 371 (c)(1), (2), (4) Date: Aug. 5, 2003
(87) PCT Pub. No.: WO01/84608
PCT Pub. Date: Aug. 11, 2001

(65) Prior Publication Data
US 2004/0048448 A1 Mar. 11, 2004

(30) Foreign Application Priority Data
Apr. 28, 2000 (JP) .................................. 2000-130434

(51) Int. Cl.[7] .................... H01L 21/20; H01L 21/36; H01L 31/3028; H01L 31/0336
(52) U.S. Cl. ................... 438/481; 438/341; 438/683; 257/190; 257/79
(58) Field of Search ......................... 438/481, 483, 438/497–498, 500, 503, 504, 507, 492, 494, 341; 257/190, 200, 79

(56) References Cited

U.S. PATENT DOCUMENTS

| 5,185,290 A | 2/1993 | Aoyagi et al. |
| 5,798,536 A | 8/1998 | Tsutsui |

(List continued on next page.)

FOREIGN PATENT DOCUMENTS

EP 0 551 721 A2 11/1992

(List continued on next page.)

OTHER PUBLICATIONS

Nam, et al., "Lateral Epitaxy of Low Defect Density GaN Layers via Organometallic Vapor Phase Epitaxy", Appl. Phys. Lett. 71 (18), Nov. 3, 1997, pp. 2638–2640.
Dimitriadis, et al., "Contacts of Titanium Nitride to n–Type and p–Type Gallium Nitride Films", Solid–State Electronics 43, 1999, pp. 1969–1972.

(List continued on next page.)

*Primary Examiner*—Shouxiang Hu
(74) *Attorney, Agent, or Firm*—McGinn & Gibb, PLLC

(57) ABSTRACT

A GaN layer 31 is subjected to etching, so as to form an island-like structure having, for example, a dot, stripe, or grid shape, thereby providing a trench/mesa structure including mesas and trenches whose bottoms sink into the surface of a substrate base 1. Subsequently, a GaN layer 32 is lateral-epitaxially grown with the top surfaces of the mesas and sidewalls of the trenches serving as nuclei, to thereby fill upper portions of the trenches (depressions of the substrate base 1), and then epitaxial growth is effected in the vertical direction. In this case, propagation of threading dislocations contained in the GaN layer 31 can be prevented in the upper portion of the GaN layer 32 that is formed through lateral epitaxial growth. Thereafter, the remaining GaN layer 31 is removed through etching, together with the GaN layer 32 formed atop the GaN layer 31, and subsequently, a GaN layer 33 is lateral-epitaxially grown with the top surfaces of mesas and sidewalls of trenches serving as nuclei, the mesas and trenches being formed of the remaining GaN layer 32, thereby producing a GaN substrate 30 in which threading dislocations are considerably suppressed. When the area of a portion of the GaN layer 31 at which the GaN substrate 30 is in contact with the substrate base 1 is reduced, separation of the GaN substrate 30 from the substrate base 1 is readily attained.

22 Claims, 9 Drawing Sheets

U.S. PATENT DOCUMENTS

| | | | |
|---|---|---|---|
| 6,051,849 A | 4/2000 | Davis et al. | |
| 6,110,277 A | 8/2000 | Braun | |
| 6,121,121 A | 9/2000 | Koide | |
| 6,146,457 A | 11/2000 | Solomon | |
| 6,153,010 A | 11/2000 | Kiyoku et al. | |
| 6,255,198 B1 * | 7/2001 | Linthicum et al. | 438/481 |
| 6,265,289 B1 * | 7/2001 | Zheleva et al. | 438/503 |
| 6,274,518 B1 | 8/2001 | Yuri et al. | |
| 6,319,742 B1 | 11/2001 | Hayashi et al. | |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,380,108 B1 * | 4/2002 | Linthicum et al. | 438/791 |
| 6,693,021 B1 * | 2/2004 | Motoki et al. | 438/481 |

FOREIGN PATENT DOCUMENTS

| | | |
|---|---|---|
| EP | 0 951 055 A2 | 10/1999 |
| EP | 0 779 666 A3 | 3/2000 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 A | 7/1982 |
| JP | 58-033882 | 2/1983 |
| JP | 01-316459 | 12/1989 |
| JP | 03-133182 A | 6/1991 |
| JP | 04-010665 A | 1/1992 |
| JP | 04-084418 | 3/1992 |
| JP | 4-303920 | 10/1992 |
| JP | 05-041536 | 2/1993 |
| JP | 05-110206 | 4/1993 |
| JP | 5-283744 | 10/1993 |
| JP | 5-343741 | 12/1993 |
| JP | 06-196757 | 7/1994 |
| JP | 07-249830 | 9/1995 |
| JP | 07-273367 | 10/1995 |
| JP | 08-064791 | 3/1996 |
| JP | 08-102549 | 4/1996 |
| JP | 8-116090 | 5/1996 |
| JP | 08-222812 | 8/1996 |
| JP | 8-274411 | 10/1996 |
| JP | 9-162125 | 6/1997 |
| JP | 10-312971 | 11/1998 |
| JP | 10-321954 | 12/1998 |
| JP | 11-031864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-021789 | 1/2000 |
| JP | 2000-044121 | 2/2000 |
| JP | 2000-091253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-060719 | 3/2001 |
| JP | 2001-093837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO97/11518 | 3/1997 |
| WO | WO98/47170 | 10/1998 |
| WO | WO 99/01594 | 1/1999 |
| WO | PCT WO 00/04615 | 1/2000 |
| WO | WO 00/55893 | 9/2000 |
| WO | WO 02/058120 A1 | 7/2002 |

OTHER PUBLICATIONS

Zheleva, et al., "Pendeo–Epitaxy–13 A New Approach for Lateral Growth of Gallium Nitride Structures", MRS Internet J. Nitride Semicond. Res. 4A1, G3.38, 1999, 6 pages total.

Uchida, et al., "A:GaInN Based Laser Diodes", In–Plans Semiconductor Lasers IV, III–Vs Review vol. 13, No. 3, May/Jun. 2000, pp. 156–164.

Zheleva, et al., "Pendeo–Epitaxy Versus Lateral Epitaxial Overgrowth of GaN: A Comparative Study via Finite Element Analysis", Journal of Electronic Materials, vol. 28, No. 4, Apr. 1999, pp. 545–551.

Yang, et al., "High Quality GaN–InGaN Heterostructures Grown on (III)Silicon Substrates", Appl. Phys. Lett. 69 (23), Dec. 2, 1996, pp. 3566–3568.

Akasaki, et al., "Effects of AlN Buffer Layer on Crystallographic Structure and on Electrical and Optical Properties of GaN and Ga1–xA1xN . . . MOVPE", Journal of Crystal Growth 98, North–Holland, Amsterdam, 1989, pp. 209–219.

Wolf, et al., "Silicon: Single Crystal Growth and Wafer Preparation", for the VLSI Era, vol. 1–Process Technology, p. 5.

Hiramatsu, et al., "Selective Area Growth and Epitaxial Lateral Overgrowth of GaN by Metalorganic Vapor Phase Epitaxy and Hydride Vapor Phase Epitaxy", Materials Science and Engineering B59, 1999, pp. 104–111.

Zheleva, et al., "Pendeo–Epitaxy: A New Approach for Lateral Growth of Gallium Nitride Films", Journal of Electronic Materials, vol. 28, No. 4, 1999, pp. L5–L8.

Luther, et al., "Titanium and Titanium Nitride Contacts to n–Type Gallium Nitride", Semicond. Sci. Technol. 13, 1998, pp. 1322–1327.

European Search Report dated Jul. 18, 2000 (EP 27057).
European Search Report dated Feb. 15, 2002 (EP 27279).
PCT Form 210 (PCT/JP02/02628).
PCT Form 210 (PCT/JP01/01928).
PCT Form 210 (PCT/JP00/09220).
PCT Form 210 (PCT/JP02/05446).
PCT Form 210 (PCT/JP02/01159).
PCT Form 210 (PCT/JP01/01178).
PCT Form 210 (PCT/JP01/02695).
PCT Form 210 (PCT/JP/01/01663).

PCT Form 210 (PCT/JP00/09120).
PCT Form 210 (PCT/JP01/01396).
PCT Form 210 (PCT/JP00/09121).
PCT Forms 338 and 409 (PCT/JP00/09120).
PCT Forms 338 and 409 (PCT/JP00/09121).
PCT Forms 338 and 409 (PCT/JP01/01396) with translation thereof.
PCT Forms 338 and 409 (PCT/JP01/01928) with translation thereof.
PCT Forms 338 and 409 (PCT/JP01/02695) with translation thereof.
PCT Forms 338 and 409 (PCT/JP01/01663) with translation thereof.
Wolf et al., "Silicon Processing for the VLSI Era," vol. 1, p. 5, Lattice Press, 1986.

D. Kapolnek et al., "Anisotropic epitaxial lateral growth in GaN selective area epitaxy", Appl. Phys. Lett. 71(9), Sep. 1, 1997, pp. 1204–1206.

Matsushima et al., "Selective growth of GaN on sub–micron pattern by MOVPE", Technical Report of IEICE, ED97–32, CPM97–20 (May 1997) pp. 41–46.

Ujiie et al., "Epitaxial Lateral Overgrowth of GaAs on a Si Substrate", Japanese Journal of Applied Physics vol. 28, No. 3, Mar., 1989, pp. L337–L339.

Partial Translation of the Office Action for Japanese Patent Application No. 9–311518 dated Jun. 10, 2003.

* cited by examiner

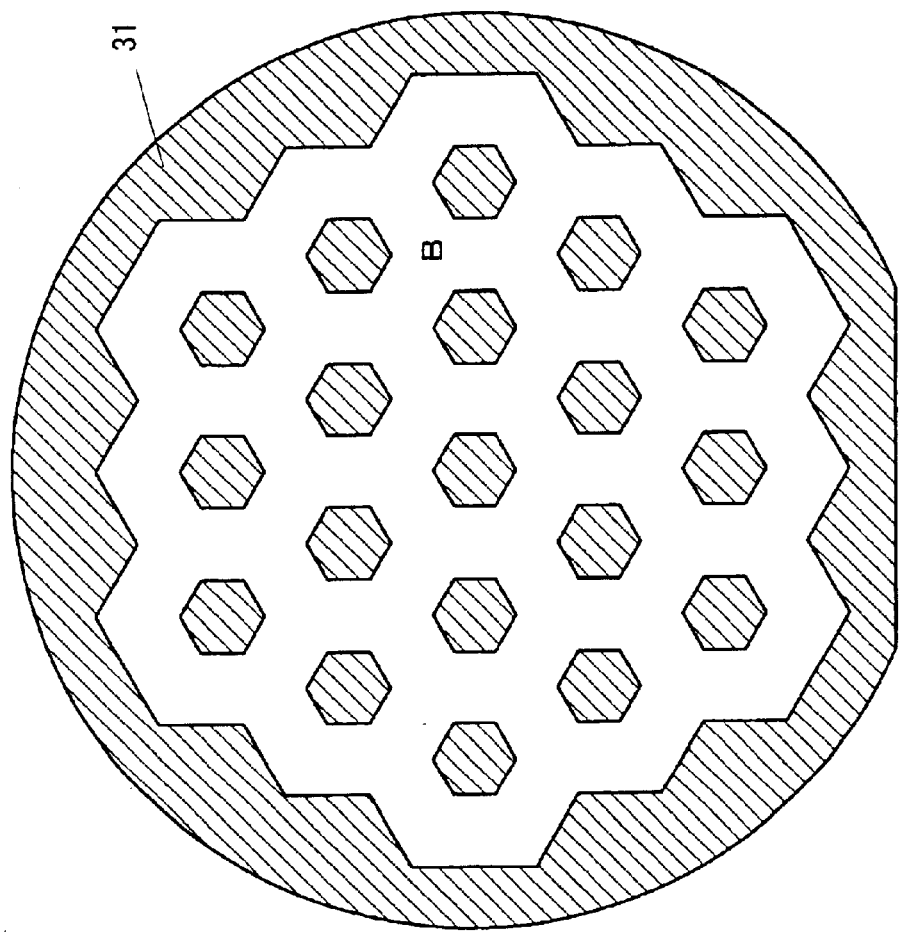
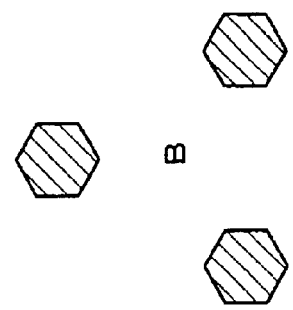
FIG. 8A
FIG. 8B

METHOD FOR FABRICATING GROUP III NITRIDE COMPOUND SEMICONDUCTOR SUBSTRATES AND SEMICONDUCTOR DEVICES

TECHNICAL FIELD

The present invention relates to a method for fabricating Group III nitride compound semiconductor substrates. More particularly, the present invention relates to a method for fabricating Group III nitride compound semiconductor substrates employing epitaxial lateral overgrowth (ELO). Like the case of semiconductor substrates produced by methods other than the method of the present invention, the Group III nitride compound semiconductor substrate produced by the method of the present invention is useful for forming a semiconductor device. The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$). In the present specification, unless otherwise specified, "Group III nitride compound semiconductors" comprise Group III nitride compound semiconductors which are doped with an impurity so as to get p-type or n-type conductivity.

BACKGROUND ART

Group III nitride compound semiconductor are direct-transition type of semiconductors exhibiting a wide range of emission spectra from UV to red light when used in a device such as a light-emitting device, for example, light-emitting diodes (LEDs) and laser diodes (LDs). In addition, due to their wide band gaps, devices employing the aforementioned semiconductors are expected to exhibit reliable operational characteristics at high temperature as compared with those employing semiconductors of other types, and thus application thereof to transistors such as FETs has been energetically studied. Moreover, because Group III nitride compound semiconductors contain no arsenic (As) as a predominant element, application of Group III nitride compound semiconductors to various semiconductor elements has been expected from the environmental aspect. Generally, these Group III nitride compound semiconductors are formed on a sapphire substrate.

DISCLOSURE OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, a life time of an LED or LD, etc. On the other hand, when a Group III nitride compound semiconductor is incorporated in any of other types of semiconductor devices, because electrons are scattered due to defects in the Group III nitride compound semiconductor, the semiconductor element comes to have low mobility. These problems are not solved even when another type of substrate is employed.

The aforementioned dislocations will next be described with reference to a schematic representation shown in FIG. 9. FIG. 9 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by laminating various types of Group III nitride compound semiconductors of interest on the Group III nitride compound semiconductor layer 93, threading dislocations further propagate upward, through the semiconductor device, from dislocation arrival points 902 on the surface of the Group III nitride compound semiconductor layer 93. Thus, according to conventional techniques, problematic propagation of dislocations cannot be prevented during formation of Group III nitride compound semiconductor layers.

There have been proposed techniques in which a thick Group III nitride compound semiconductor layer is formed on a substrate base formed of a compound different from a Group III nitride compound, and subsequently the substrate base is removed, to thereby produce a Group III nitride compound semiconductor substrate. Such techniques include a technique called ELO or Pendeo ELO. However, the aforementioned techniques have not been put into practice, since difficulty is encountered in removing a Group III nitride compound semiconductor substrate from the substrate base.

The present invention has been accomplished in an attempt to solve the aforementioned problems, and an object of the present invention is to provide a convenient method for fabricating a Group III nitride compound semiconductor substrate with suppressed generation of threading dislocations. Another object of the present invention is to provide a semiconductor device including the Group III nitride compound semiconductor substrate with suppressed generation of threading dislocations.

In order to solve the aforementioned problems, the invention drawn to a first feature provides a method for fabricating a Group III nitride compound semiconductor substrate through epitaxial growth of a Group III nitride compound semiconductor layer on a substrate base, followed by removal of the substrate base, which method comprises a step of forming an underlying layer on a substrate base, the underlying layer comprising at least one Group III nitride compound semiconductor layer, and the uppermost layer of the underlying layer being a first Group III nitride compound semiconductor layer; a first trench/mesa formation step in which at least a portion of the underlying layer and at least a portion of the surface of the substrate base are removed through etching so as to form an island-like structure having, for example, a dot, stripe, or grid shape, thereby providing a trench/mesa structure including mesas formed on the underlying layer and trenches whose bottoms sink into the surface of the substrate base; a first lateral epitaxial growth step in which a second Group III nitride compound semiconductor layer is epitaxially grown, vertically and laterally, with top surfaces of the mesas and sidewalls of the trenches serving as nuclei for crystal growth, i.e., seeds for crystal growth, the mesas and trenches being formed by etching of the first Group III nitride compound semiconductor layer so as to form an island-like structure having, for example, a dot, stripe, or grid shape, thereby filling upper portions of the trenches and covering the mesas; a second trench/mesa formation step in which the entire underlying layer that has not undergone etching in the first trench/mesa formation step, excepting a portion of the underlying layer, is removed by etching, together with the second Group III nitride compound semiconductor layer formed on the underlying layer, and at least a portion of the surface of the substrate base, so as to provide a trench/mesa structure including mesas formed on the remaining second Group III nitride compound semiconductor layer and trenches whose bottoms sink into the surface of the substrate base; a second lateral epitaxial growth step in which a third Group III nitride compound semiconductor layer is epitaxially grown, vertically and laterally, with top surfaces of the mesas and sidewalls of the trenches serving as nuclei for crystal growth, i.e., seeds for crystal growth, the mesas and trenches being formed through etching of the second Group III nitride compound semiconductor layer, thereby filling upper portions of the trenches and covering the mesas; and a step of removing the substrate base and the underlying layer which has not been removed in the second trench/mesa formation step, to thereby produce a substrate comprising the second and third Group III nitride compound semiconductor layers. In the present specification, the term "underlying layer" is used to collectively comprise a Group III nitride compound semiconductor single layer and a multi-lamellar layer containing at least one Group III nitride compound semiconductor layer. The expression "island-like structure" conceptually refers to the pattern of the upper portions of the mesas formed through etching, and does not necessarily refer to regions separated from one another. Thus, the upper portions of the mesas may be continuously connected to one another over a considerably wide area, and such a structure may be obtained by forming the entirety of a wafer into stripes or grids. The sidewall/sidewalls of the trench refer not only to planes that are vertical to the substrate plane and the surface of a Group III nitride compound semiconductor layer, but also to oblique planes. The trench may have a V-shaped cross section; i.e., the trench may have no bottom surface. The expression "filling upper portions of the trench" does not necessarily refer to the case where the upper portions are completely filled so as to provide no space, and a space may be provided. Examples of such a space include a space generated through incomplete growth of a Group III nitride compound semiconductor layer as a result of insufficient feeding of a raw or source material to epitaxial growth fronts starting from the sidewalls of the trench; and a gap between the substrate plane and a Group III nitride compound semiconductor layer. Unless otherwise specified, these definitions are equally applied to the below-described features.

The invention drawn to a second feature provides a method for fabricating a Group III nitride compound semiconductor substrate comprising epitaxial growth of a Group III nitride compound semiconductor layer on a substrate base, and removal of the substrate base, which method comprises a step of forming an underlying layer on a substrate base, the underlying layer comprising at least one Group III nitride compound semiconductor layer, and the uppermost layer of the underlying layer being a first Group III nitride compound semiconductor layer; a first trench/mesa formation step in which the underlying layer is etched so as to form an island-like structure having, for example, a dot, stripe, or grid shape, thereby providing a trench/mesa structure, such that the substrate base is exposed so as to provide the bottoms of trenches; a first mask formation step in which first masks are formed at the bottoms of the trenches formed in the first trench/mesa formation step, such that the upper surfaces of the first masks are positioned below the top surface of the uppermost layer of the underlying layer; a first lateral epitaxial growth step in which a second Group III nitride compound semiconductor layer is epitaxially grown, vertically and laterally, with top surfaces of mesas and sidewalls of the trenches serving as nuclei for crystal growth, i.e., seeds for crystal growth, the mesas and trenches being formed by etching of the first Group III nitride compound semiconductor layer so as to form an island-like structure having, for example, a dot, stripe, or grid shape, thereby filling spaces above the first masks and covering the mesas; a second trench/mesa formation step in which substantially the entire underlying layer that has not undergone etching in the first trench/mesa formation step is removed through etching, together with the second Group III nitride compound semiconductor layer formed on the underlying layer, so as to provide a trench/mesa structure including mesas formed on the remaining second Group III nitride compound semiconductor layer and trenches such that the substrate base is exposed so as to provide the bottoms of the trenches; a second mask formation step in which second masks are formed at the bottoms of the trenches formed in the second trench/mesa formation step, such that the upper surfaces of the second masks are positioned below the top surface of the second Group III nitride compound semiconductor layer; a second lateral epitaxial growth step in which a third Group III nitride compound semiconductor layer is epitaxially grown, vertically and laterally, with top surfaces of the mesas and sidewalls of the trenches serving as nuclei for crystal growth, i.e., seeds for crystal growth, the mesas and trenches being formed by etching of the second Group III nitride compound semiconductor layer, thereby filling spaces above the second masks and covering the mesas; a step of removing the first and second masks by wet etching; and a step of removing the substrate base, to thereby produce a substrate comprising the second and third Group III nitride compound semiconductor layers.

The invention drawn to a third feature provides a method for fabricating a Group III nitride compound semiconductor substrate as recited in connection with the second feature, wherein the masks are formed of a substance capable of impeding epitaxial growth of a Group III nitride compound semiconductor layer on the masks.

The invention drawn to a fourth feature provides a method for fabricating a Group III nitride compound semiconductor substrate as recited in connection with any one of the first through third features, wherein virtually all the sidewalls of the trenches formed in the first and second trench/mesa formation steps are a {11-20} plane.

The invention drawn to a fifth feature provides a method for fabricating a Group III nitride compound semiconductor substrate as recited in connection with any one of the first through fourth features, wherein the first Group III nitride compound semiconductor layer and the second Group III nitride compound semiconductor layer have the same composition. In the context of the present invention, compositions which differ from one another on doping level (differences of less than 1 mol %) are referred to as the "same composition."

The invention drawn to a sixth feature provides a method for fabricating a Group III nitride compound semiconductor substrate as recited in connection with any one of the first through fifth features, wherein the second Group III nitride compound semiconductor layer and the third Group III nitride compound semiconductor layer have the same composition. In the context of the present invention, compositions which differ from one another on doping level (differences of less than 1 mol %) are referred to as the "same composition."

The invention drawn to a seventh feature provides a Group III nitride compound semiconductor device, which is formed on a Group III nitride compound semiconductor substrate produced through a method for fabricating a Group III nitride compound semiconductor substrate as recited in connection with any one of the first through sixth features.

The invention drawn to an eighth feature provides a Group III nitride compound semiconductor light-emitting device, which is produced by laminating a different Group III nitride compound semiconductor layer on a Group III nitride compound semiconductor substrate produced through a method for fabricating a Group III nitride compound semiconductor substrate as recited in connection with any one of the first through sixth features.

The outline of the method for fabricating a Group III nitride compound semiconductor substrate of the present invention will next be described with reference to FIGS. 1 through 4. Although FIGS. 1 and 3 illustrate structures including a substrate base 1 and a buffer layer 2, the buffer layer 2 is not an essential element of the present invention, in view that the object of the present invention is to produce, by-performing etching twice and lateral epitaxial growth twice, a Group III nitride compound semiconductor substrate having reduced threading dislocations in the vertical direction from a first Group III nitride compound semiconductor layer having threading dislocations in the vertical direction. The gist of the operation and effects of the present invention will next be described with reference to embodiments in which a first Group III nitride compound semiconductor layer 31 having threading dislocations in the vertical direction (direction vertical to the substrate surface) is formed above the substrate base 1 via the buffer layer 2.

As shown in FIG. 1(a), the first Group III nitride compound semiconductor layer 31 is formed above the substrate base 1 via the buffer layer 2. Subsequently, as shown in FIG. 1(b), the first Group III nitride compound semiconductor layer 31 is subjected to etching, so as to form an island-like structure having, for example, a dot, stripe, or grid shape, thereby providing first trenches/mesas such that depressions of the substrate base 1 are exposed so as to form the bottoms of the trenches. Subsequently, a second Group III nitride compound semiconductor layer 32 is epitaxially grown, vertically and laterally, with top surfaces of the first mesas or posts and sidewalls of the first trenches serving as nuclei for crystal growth, i.e., seeds for crystal growth, to thereby fill spaces above the trenches of the substrate base 1, while epitaxial growth is effected in the vertical direction. In this case, propagation of threading dislocations contained in the first Group III nitride compound semiconductor layer 31 can be prevented in the upper portion of the second Group III nitride compound semiconductor layer 32 that is formed by lateral epitaxial growth (FIGS. 1(c) and 1(d)). That is, no threading dislocations propagate, in the vertical direction, through a portion that is laterally grown with the sidewalls of the trenches serving as nuclei for crystal growth. The first Group III nitride compound semiconductor layer 31 is strongly bonded to the substrate base 1 via the buffer layer 2. Meanwhile, the second Group III nitride compound semiconductor layer 32 is not strongly bonded to the substrate base 1, since the layer 32 is not in direct contact with the substrate base 1, or the area of a portion at which the layer 32 is in direct contact with the substrate base 1 is very small. Therefore, portions of the second Group III nitride compound semiconductor layer 32 that are formed above the trenches of the substrate base 1 do not receive stress directly from the substrate base 1.

Subsequently, the first mesas (i.e., the first Group III nitride compound semiconductor layer 31 and the buffer layer 2 that have not undergone etching) are subjected to etching, together with the second Group III nitride compound semiconductor layer 32 formed on the layer 31. The substrate base 1 is also subjected to etching, to thereby form depressions or trenches. This etching provides second trenches/mesas; i.e., laterally epitaxially grown portions of the second Group III nitride compound semiconductor layer 32 (FIG. 2(e)). When, although not illustrated in FIG. 2(e), the first Group III nitride compound semiconductor layer 31 is caused to partially remain on the substrate base and to be bonded thereto, the mesas formed of the second Group III nitride compound semiconductor layer 32 can be provided over a wide region as shown in FIG. 2(e), in which the mesas can be viewed as if they were floating above the substrate base. In this case, threading dislocations are considerably reduced in the second Group III nitride compound semiconductor layer 32 which has been formed as the second mesas. Subsequently, a third Group III nitride compound semiconductor layer 33 is epitaxially grown, vertically and laterally, with top surfaces of the second mesas and sidewalls of the second trenches serving as nuclei for crystal growth, i.e., seeds for crystal growth, which are formed of the second Group III nitride compound semiconductor layer 32 (FIG. 2(f)). The thus-grown third Group III nitride compound semiconductor layer 33 has virtually no threading dislocations that propagate therethrough in the vertical direction. Like the case of the second Group III nitride compound semiconductor layer 32, the third Group III nitride compound semiconductor layer 33 has virtually no contact with the substrate base 1. Therefore, portions of the third Group III nitride compound semiconductor layer 33 that are formed above the trenches of the substrate base 1 do not receive stress directly from the substrate base 1. After the third Group III nitride compound semiconductor layer 33 is formed so as to have a large thickness (FIG. 2(g)), the substrate base 1 is removed, to thereby produce a Group III nitride compound semiconductor substrate 30 having virtually no threading dislocations (FIG. 2(h)). The substrate base 1 is bonded to the Group III nitride compound semiconductor substrate 30 by means of merely a portion including the first Group III nitride compound semiconductor layer 31 and the buffer layer 2 that have remained during formation of the second trenches/mesas, and the area of the portion is very small. When the portion is removed together with the base substrate 1, or when the portion including the first Group III nitride compound semiconductor layer 31 and the buffer layer 2 is separated from the second and third Group III nitride compound semiconductor layers 32 and 33 formed above the trenches of the substrate base 1, the Group III nitride compound semiconductor substrate 30 having virtually no threading dislocations can be readily produced. The expression "removing all the underlying layer, excepting a portion thereof" does not exclude the case in which a portion containing threading dislocations is present to some extent, for the sake of convenience in manufacture. The method of the present invention encompasses a process in which etching and vertical and lateral epitaxial growth are performed three times or more, and virtually all the underlying layer is removed, to thereby produce a Group III nitride compound semiconductor substrate; a process in which a fourth Group III nitride compound semiconductor layer is formed while the third Group III nitride compound semiconductor layer 33 is formed so as to have a large thickness; and a process in which a different epitaxial technique is employed (the first feature).

In the aforementioned process, in order to reduce the area of a portion at which the second or third Group III nitride compound semiconductor layer is in contact with the substrate base 1, the substrate base 1 is subjected to etching to thereby form depressions. Meanwhile, the following process as shown in FIGS. 3 and 4 may be performed: the surface of a substrate base 1 is exposed; masks 41 and 42 are formed on the thus-exposed substrate base 1; and the masks are removed through wet etching at the final step (i.e., the step subsequent to the step shown in FIG. 4(g)), to thereby provide a space between a Group III nitride compound semiconductor substrate and the substrate base 1 (the second feature). When the masks are formed of a substance capable of impeding epitaxial growth of a Group III nitride compound semiconductor layer on the masks, during epitaxial growth and after epitaxial growth, the Group III nitride compound semiconductor layer does not receive stress from the substrate base 1 via the masks (the third feature).

The aforementioned rapid lateral epitaxial growth can be readily attained when the sidewalls of the trenches formed by etching of the Group III nitride compound semiconductor layer 31 are a {11-20} plane (the fourth feature). During lateral epitaxial growth, at least an upper portion of the growth front may remain a {11-20} plane. When the first Group III nitride compound semiconductor layer and the second Group III nitride compound semiconductor layer have the same composition, rapid lateral epitaxial growth can be readily attained (the fifth feature). Similar to the case described above, when the second Group III nitride compound semiconductor layer and the third Group III nitride compound semiconductor layer have the same composition, rapid lateral epitaxial growth can be readily attained (the sixth feature).

Through the procedure described above, the Group III nitride compound semiconductor substrate 30 can be readily removed from the substrate base 1, and threading dislocations contained in the substrate 30 can be reduced to the lowest possible level. Although FIGS. 1 through 4 illustrate sidewalls of trenches vertical to the substrate base, the present invention is not limited thereto, and the sidewalls may be oblique planes. So long as the first Group III nitride compound semiconductor layer 31 and the buffer layer 2 are removed through a combination of the first and second trench/mesa formation steps, the trenches formed in the first or second trench/mesa formation step may have V-shaped cross sections. These features are equally applied to the descriptions below.

When a device is formed on the Group III nitride compound semiconductor substrate produced through the above process, a semiconductor device having a layer containing few defects and endowed with high mobility can be provided (the seventh feature).

When a light-emitting device is formed on the Group III nitride compound semiconductor substrate produced through the above process, a light-emitting device endowed with improved life time and an improved LD threshold value can be provided (the eighth feature).

BRIEF DESCRIPTION OF THE DRAWINGS

FIGS. 8A and 8B are a schematic representation showing another example of etching of the first Group III nitride compound semiconductor layer.

BEST MODE FOR CARRYING OUT THE INVENTION

Figure 1A:
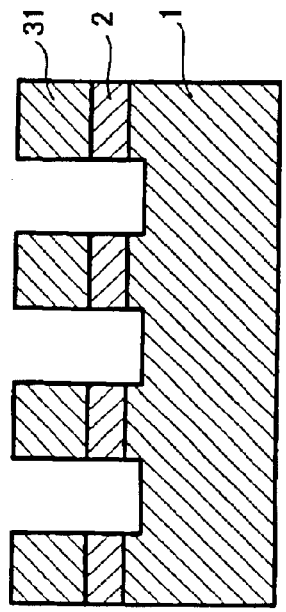
FIGS. 1A–1D are a series of cross-sectional views showing the first half of the steps of fabricating a Group III nitride compound semiconductor substrate according to a first embodiment of the present invention.
Figure 1B:
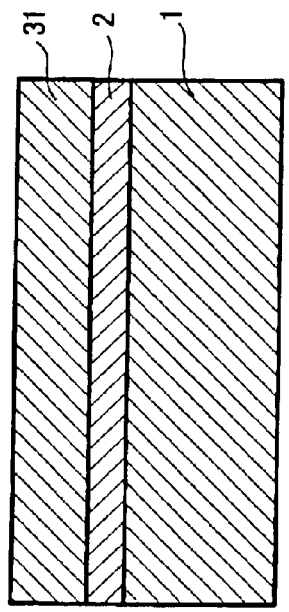
Figure 1C:
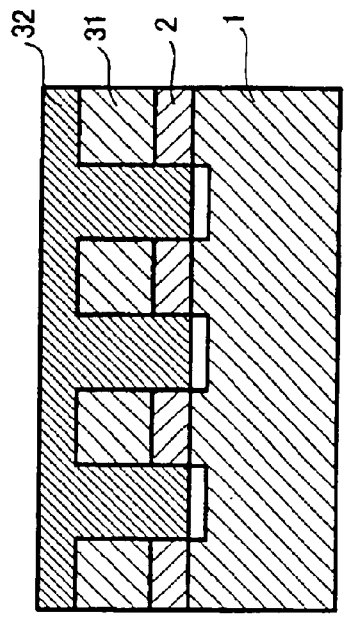
Figure 1D:
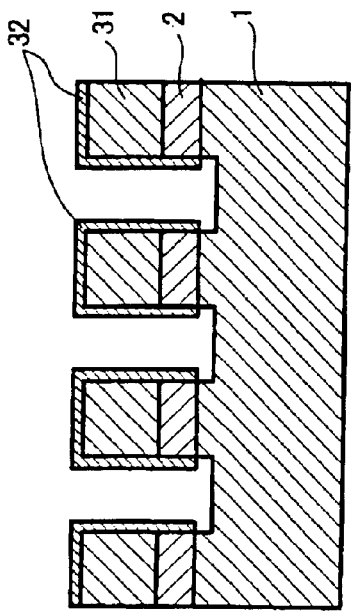

FIGS. 1 through 4 schematically show a mode for carrying out the method for fabricating a Group III nitride compound semiconductor substrate of the present invention. A substrate base 1, a buffer layer 2, and a first Group III nitride compound semiconductor layer 31 are formed (FIG. 1(a)), and the layers 2 and 31 are subjected to etching, to thereby form trenches (FIG. 1(b)). As a result of etching, first mesas and trenches are formed, the unetched surfaces of the layer 31 become the top surfaces of the mesas, sidewalls of the trenches are formed, and bottoms of the trenches are formed; i.e., depressions are formed on the substrate base 1. The sidewalls are, for example, {11-20} planes. Subsequently, under conditions of lateral epitaxial growth, a second Group III nitride compound semiconductor layer 32 is epitaxially grown with the sidewalls of the first trenches and the top surfaces of the first mesas serving as nuclei for crystal growth, i.e., seeds for crystal growth. A metal-organic growth process enables easy lateral epitaxial growth while the growth fronts remain the {11-20} planes. Portions of the second Group III nitride compound semiconductor layer 32 that are laterally grown from the sidewalls of the trenches are free from propagation of threading dislocations (FIG. 1(c)). The form of etching and lateral epitaxial growth conditions are determined such that the fronts of lateral growth extending from the opposite sidewalls of the trenches fill the etched trenches, whereby threading dislocations are suppressed in the regions of the second Group III nitride compound semiconductor layer 32 formed above the bottoms of the etched trenches (FIG. 1(d)). Thereafter, the first Group III nitride compound semiconductor layer 31 and the buffer layer 2 are removed by etching, together with the second Group III nitride compound semiconductor layer 32 formed on the layer 31, and the surface of the substrate base 1, to thereby provide second trenches/mesas formed of the second Group III nitride compound semiconductor layer 32 with suppressed threading dislocations (FIG. 2(e)). When, although not illustrated in FIG. 2(e), the first Group III nitride compound semiconductor layer 31 is caused to partially remain on the substrate base and to be bonded thereto, the mesas formed of the second Group III nitride compound semiconductor layer 32 can be provided over a wide region as shown in FIG. 2(e), in which the mesas can be viewed as if they were floating above the substrate base. Subsequently, a third Group III nitride compound semiconductor layer 33 is epitaxially grown, vertically and laterally, with top surfaces of the second mesas and sidewalls of the second trenches serving as nuclei for crystal growth, i.e., seeds for crystal growth, the mesas and trenches being formed of the second Group III nitride compound semiconductor layer 32 with suppressed threading dislocations (FIG. 2(f)), whereby virtually no threading dislocations are generated in the third Group III nitride compound semiconductor layer 33. After the third Group III nitride compound semiconductor layer 33 is formed so as to have a large thickness (FIG. 2(g)), the substrate base 1 is removed, to thereby produce a Group III nitride compound semiconductor substrate 30 (FIG. 2(h)). The substrate base 1 is bonded to the Group III nitride compound semiconductor substrate 30 via merely a portion including the first Group III nitride compound semiconductor layer 31 and the buffer layer 2 that have remained during formation of the second trenches/mesas. Therefore, when the portion is removed, or when the portion is separated from the second and third Group III nitride compound semiconductor layers 32 and 33, the Group III nitride compound semiconductor substrate 30 is produced. As shown in FIGS. 3 and 4, when masks 41 on which a Group III nitride compound semiconductor layer is not epitaxially grown are provided at the bottoms of the first trenches, and masks 42 on which a Group III nitride compound semiconductor layer is not epitaxially grown are provided at the bottoms of the second trenches, in a manner similar to that described above, the Group III nitride compound semiconductor substrate 30 can be readily produced. The masks 41 and 42 are preferably formed of a substance which can be removed through, for example, wet etching.

There may be employed an underlying layer including a plurality of sub-layer units, each unit having a buffer layer and a Group III nitride compound semiconductor layer grown epitaxially on the buffer layer, wherein the lowermost unit includes a buffer layer formed directly on the substrate base 1. Regardless of the number of the units, the substrate base 1 is exposed through the bottoms of the trenches formed in the underlying layer. Portions of the Group III nitride compound semiconductor layer 32 formed above the bottoms of the trenches are formed primarily through lateral epitaxial growth while the Group III nitride compound semiconductor layer 31, which is the top layer of the mesas, serves as nuclei, thereby becoming regions in which threading dislocations of vertical propagation are suppressed.

The aforementioned modes for carrying out the invention may employ any of the following processes.

When Group III nitride compound semiconductor layers are successively formed on a substrate base, the substrate base may be formed from an inorganic crystal compound such as sapphire, silicon (Si), silicon carbide (SiC), spinel ($MgAl_2O_4$), ZnO, or MgO; a Group III–V compound semiconductor such as gallium phosphide or gallium arsenide; or a Group III nitride compound semiconductor having threading dislocations, such as gallium nitride (GaN).

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (Halide VPE), liquid phase epitaxy (LPE), or the like may be used. Also, individual layers may be formed by different growth processes.

When a Group III nitride compound semiconductor layer is to be formed on, for example, a sapphire substrate serving as a substrate base, in order to impart good crystallinity to the layer, a buffer layer is preferably formed for the purpose of correcting lattice mismatch with the sapphire substrate. When a substrate of another material is to be used as a substrate base, employment of a buffer layer is also preferred. A buffer layer is preferably of a Group III nitride compound semiconductor $Al_xGa_yIn_{1-x-y}N$ formed at low temperature ($0 \leq x \leq 1, 0 \leq y \leq 1, 0 \leq x+y \leq 1$), more preferably of $Al_xGa_{1-x}N$ ($0 \leq x \leq 1$). This buffer layer may be a single layer or a multi-component layer containing layers of different compositions. A buffer layer may be formed at a low temperature of 380 to 420° C. or by MOCVD at a temperature of 1,000 to 1,180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200 to 600° C., more preferably 300 to 500° C., most preferably 350 to 450° C. When physical vapor deposition, such as sputtering, is employed, the thickness of a buffer layer is preferably 100 to 3,000 Å, more preferably 100 to 400 Å, most preferably 100 to 300 Å. A multi-component layer may contain, for example, alternating $Al_xGa_{1-x}N$ ($0 \leq x \leq 1$) layers and GaN layers. Alternatively, a multi-component layer may contain alternating layers of the same composition formed at a temperature of not higher than 600° C. and at a temperature of not lower than 1,000° C. Of course, these arrangements may be combined. Also, a multi-component layer may contain three or more different types of Group III nitride compound semiconductors $Al_xGa_yIn_{1-x-y}N$ ($0 \leq x \leq 1$, $0 \leq y \leq 1$, $0 \leq x+y \leq 1$). Generally, a buffer layer is amorphous and an intermediate layer is monocrystalline. Repetitions of unit of a buffer layer and an intermediate layer may be formed, and the number of repetitions is not particularly limited. The greater the number of repetitions, the greater the improvement in crystallinity.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately 1/100 to 1/1,000. In the case of an underlying layer containing two or more repetitions of a buffer layer and a Group III nitride compound semiconductor layer, the Group III nitride compound semiconductor layers are further preferably doped with an element greater in atomic radius than a predominant component element. When a light-emitting element is produced after formation of a Group III nitride compound semiconductor substrate, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities. Thus, an n-type or p-type Group III nitride compound semiconductor substrate having arbitrary conductivity can be produced.

Lateral epitaxial growth preferably progresses such that the front of lateral epitaxial growth is perpendicular to a substrate base. However, lateral epitaxial growth may progress while slant facets with respect to the substrate base are maintained. In this case, trenches may have a V-shaped cross section.

Preferably, lateral epitaxial growth progresses such that at least an upper portion of the front of lateral epitaxial growth is perpendicular to the surface of a substrate base. More preferably, growth fronts are {11-20} planes of a Group III nitride compound semiconductor layer.

The depth and width of trenches to be etched are appropriately determined such that lateral epitaxial growth fills the trenches.

When the crystal orientation of a Group III nitride compound semiconductor layer to be formed on a substrate base can be predicted, masking or etching in the form of stripes perpendicular to the a-plane ({11-20} plane) or the m-plane ({1-100} plane) of the Group III nitride compound semiconductor layer is favorable. The aforementioned stripe or mask patterns may be island-like or grid-like or may assume other forms. The front of lateral epitaxial growth may be perpendicular or oblique to the surface of a substrate base. In order for the a-plane; i.e., the (11-20) plane, of a Group III nitride compound semiconductor layer to become the front of lateral epitaxial growth, the lateral direction of stripes must, for example, be perpendicular to the m-plane; i.e., the (1-100) plane, of the Group III nitride compound semiconductor layer. For example, when the surface of a substrate base is the a-plane or the c-plane of sapphire, the m-plane of sapphire usually matches the a-plane of a Group III nitride compound semiconductor layer formed on the substrate base. Thus, etching is performed according to the arrangement of the planes. In the case of dot-like, grid-like, or island-like etching, planes that define an outline (sidewalls) are preferably {11-20} planes.

An etching mask may be formed of a multi-layer film formed from a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal of high melting point, such as titanium (Ti) or tungsten (W). The film may be formed through any known method, such as a vapor-growth method (e.g., deposition, sputtering, or CVD). The mask may be removed during lateral epitaxial growth, or a Group III nitride compound semiconductor layer may be laterally epitaxially grown so as to cover the mask without removal of the mask. When the mask is removed, the laterally epitaxially grown Group III nitride compound semiconductor layer exhibits improved crystallinity. Meanwhile, when the mask is caused to remain, dislocations may be generated at the edge of the mask.

Reactive ion etching (RIE) is preferred, but any other etching process may be employed. When trenches having sidewalls oblique to the surface of a substrate base are to be formed, anisotropic etching is employed. By means of anisotropic etching, trenches are formed such that the trenches have a V-shaped cross section.

No particular limitation is imposed on the mask provided at the bottoms of trenches, so long as the mask can be removed through wet etching. Therefore, the aforementioned etching mask may be employed. The mask provided at the bottoms of the trenches may be removed through any wet etching technique. When the mask provided at the bottoms of the trenches is formed of silicon dioxide, the mask may be removed through wet etching employing a hydrofluoric-acid-based etchant.

A semiconductor device, such as an FET or a light-emitting device, can be formed on the aforementioned Group III nitride compound semiconductor substrate having virtually no threading dislocations. In the case where a light-emitting device is formed, a light-emitting layer may have a multi-quantum well (MQW) structure, a single-quantum well (SQW) structure, a homo-structure, a single-hetero-structure, or a double-hetero-structure, or the layer may be formed by means of, for example, a pin junction or a pn junction.

In order to separate the aforementioned Group III nitride compound semiconductor substrate having virtually no threading dislocations from the substrate base 1, any known technique, such as mechanochemical polishing, may be employed. The Group III nitride compound semiconductor substrate produced through the method of the present invention may be employed for forming a larger Group III nitride compound semiconductor crystal.

Embodiments of the present invention in which light-emitting elements are produced will next be described. The present invention is not limited to the embodiments described below. The present invention discloses a method for fabricating a Group III nitride compound semiconductor substrate applicable to fabrication of any device.

The Group III nitride compound semiconductor of the present invention was produced through metal-organic vapor phase epitaxy (hereinafter called "MOVPE"). The following gasses were employed: ammonia ($NH_3$), carrier gas ($H_2$ or $N_2$), trimethylgallium ($Ga(CH_3)_3$, hereinafter called "TMG")), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$").

[First Embodiment]

FIGS. 1 and 2 show the steps of the present embodiment. A monocrystalline sapphire substrate 1 whose principle surface for crystal growth is an a-plane was cleaned by organic cleaning and heat treatment. The temperature of the substrate 1 was lowered to 400° C., and $H_2$ (10 L/min), $NH_3$ (5 L/min), and TMA (20 μmol/min) were fed for about three minutes, to thereby form an AlN buffer layer 2 (thickness: about 40 nm) on the substrate 1. Subsequently, while the temperature of the sapphire substrate 1 was maintained at 1,000° C., $H_2$ (20 L/min), $NH_3$ (10 L/min), and TMG (300 μmol/min) were introduced, to thereby form a GaN layer 31 (thickness: about 1 μm) (FIG. 1(a)).

By use of a hard bake resist mask, stripe-shaped trenches each having a width of 10 μm and a depth of about 1.2 μm were formed at intervals of 10 μm through selective dry etching employing reactive ion etching (RIE). As a result, mesas formed of the GaN layer 31 and the buffer layer 2 each having a width of 10 μm and a height of about 1 μm, and depressions of the sapphire substrate 1 each having a depth of 0.2 μm were alternately formed (FIG. 1(b)). At this time, the {11-20} planes of the GaN layer 31 were caused to serve as the sidewalls of the trenches of a depth of 1 μm.

Subsequently, while the temperature of the sapphire substrate 1 was maintained at 1,150° C., $H_2$ (20 L/min), $NH_3$ (10 L/min), and TMG (2 μmol/min) were introduced, to thereby form a GaN layer 32 by lateral epitaxial growth performed while the sidewalls of the trenches of a depth of 1 μm; i.e., the {11–20} planes of the GaN layer 31, served as nuclei for crystal growth. At an initial stage, vertical epitaxial growth from the top surfaces of the mesas or posts was suppressed (FIG. 1 (c)). Lateral epitaxial growth was performed while the {11-20} planes primarily served as the growth fronts, whereby the trenches were filled, and the surface of the GaN layer 32 became flat. The overall thickness of the GaN layer 31 and the GaN layer 32 was found to be about 1.5 μm (FIG. 1(d)).

Figure 5A:
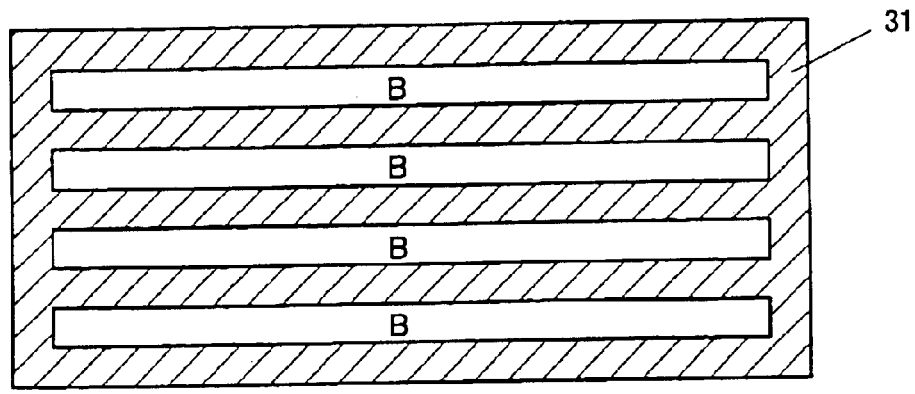
FIGS. 5A–5C are a schematic representation showing an example of etching of first and second Group III nitride compound semiconductor layers, and the second and third Group III nitride compound semiconductor layers which have been formed.
Figure 5B:
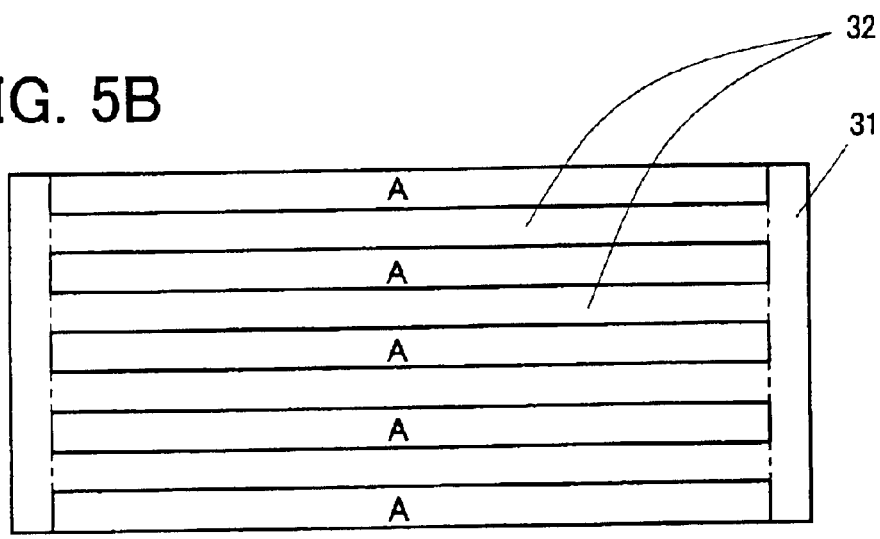
Figure 5C:
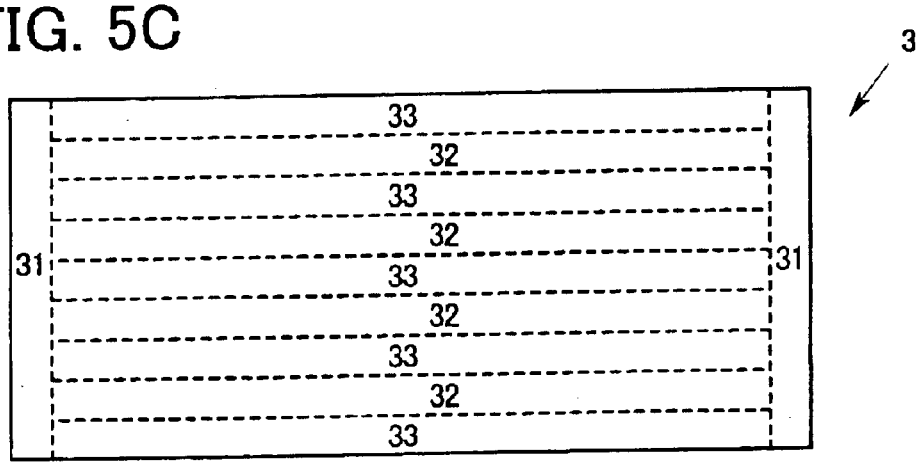

Subsequently, by use of a hard bake resist mask, stripe-shaped trenches each having a width of 10 μm and a depth of about 1.7 μm were formed at intervals of 10 μm through selective dry etching employing reactive ion etching (RIE), whereby virtually all the GaN layer 31 and the buffer layer 2 was removed, together with the GaN layer 32 formed atop the GaN layer 31 and the surface of the sapphire substrate 1 (FIG. 2(e)). FIG. 5 schematically shows the thus-formed structure. Specifically, FIG. 5(a) is a plan view corresponding to FIG. 1(b), and reference letter B of FIG. 5(a) denotes the depressions or trenches formed in the sapphire substrate 1. FIG. 5(b) is a plan view corresponding to FIG. 2(e), and reference letter A of FIG. 5(b) denotes the exposed depressions or trenches of the sapphire substrate 1. As shown in FIG. 5(b) (not illustrated in FIG. 2(e)), the GaN layer 31 is caused to remain on the periphery of the sapphire substrate 1.

Figure 2E:
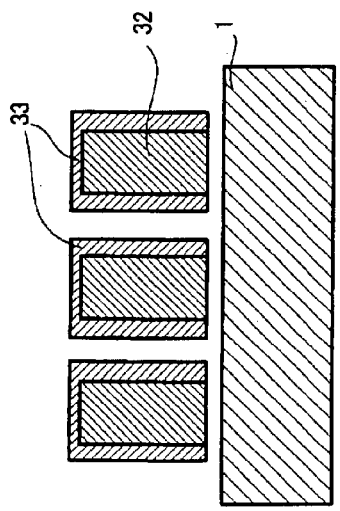
FIGS. 2E–2H are a series of cross-sectional views showing the second half of the steps of fabricating a Group III nitride compound semiconductor substrate according to the first embodiment of the present invention.
Figure 2F:
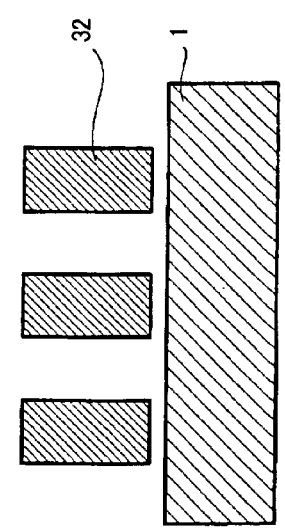
Figure 2G:
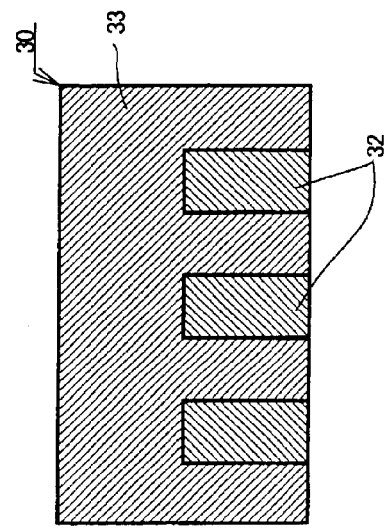
Figure 2H:
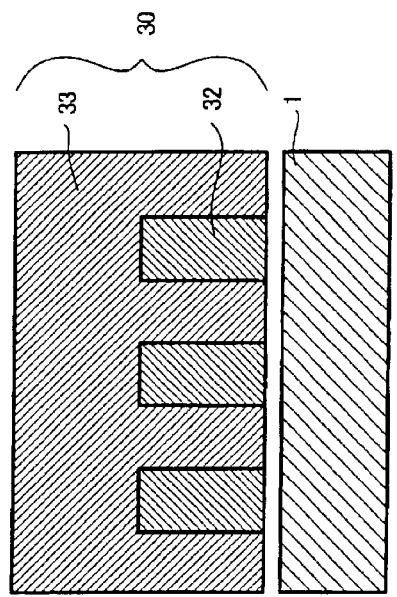
Figure 3A:
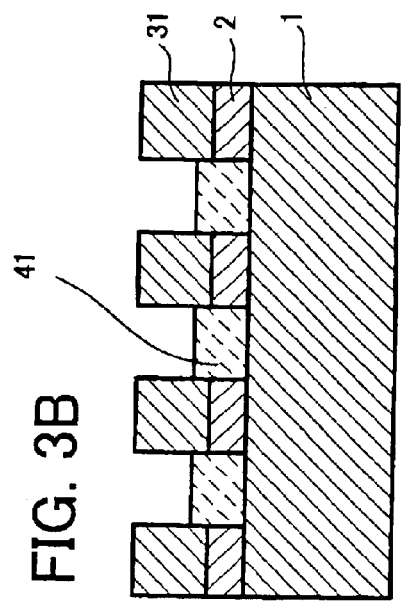
FIGS. 3A–3D are a series of cross-sectional views showing the first half of the steps of fabricating a Group III nitride compound semiconductor substrate according to a second embodiment of the present invention.
Figure 3B:
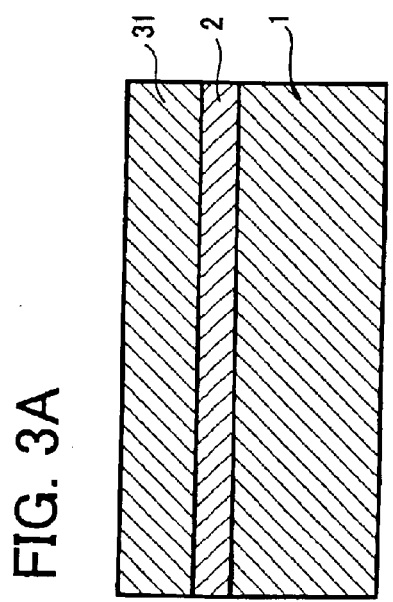
Figure 3C:
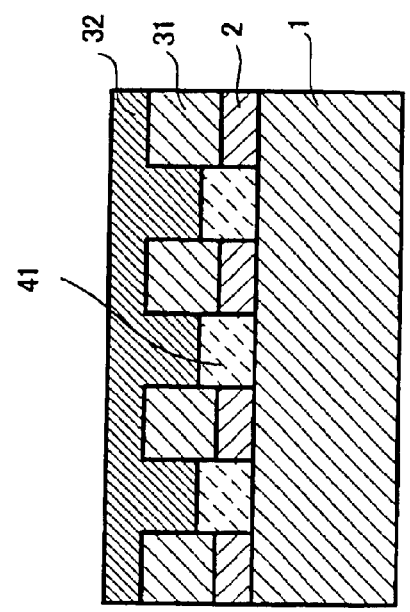
Figure 3D:
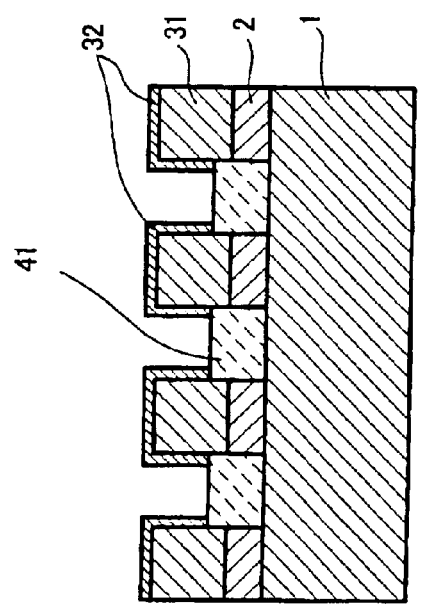
Figure 4E:
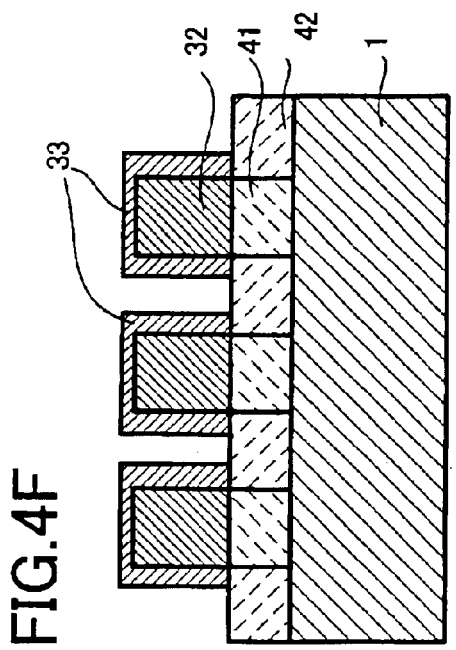
FIGS. 4E–4H are a series of cross-sectional views showing the second half of the steps of fabricating a Group III nitride compound semiconductor substrate according to the second embodiment of the present invention.
Figure 4F:
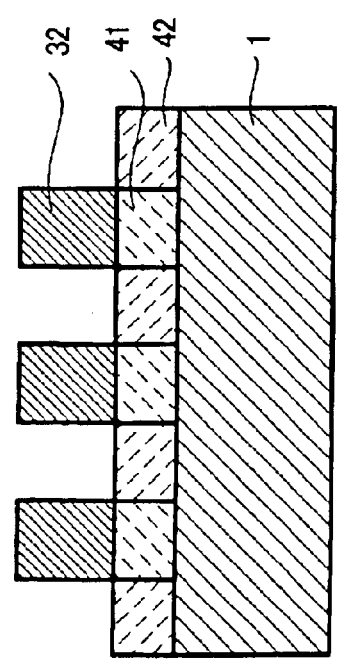
Figure 4H:
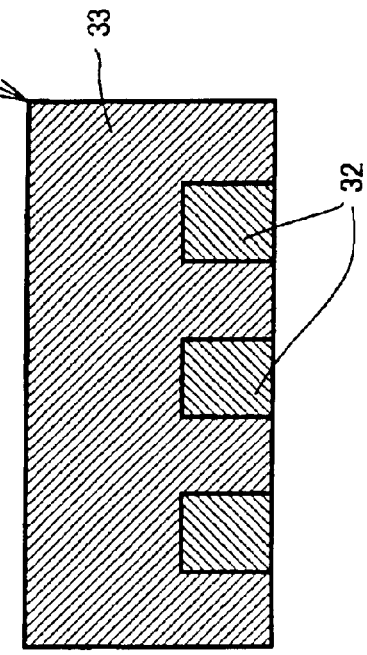
Figure 4G:
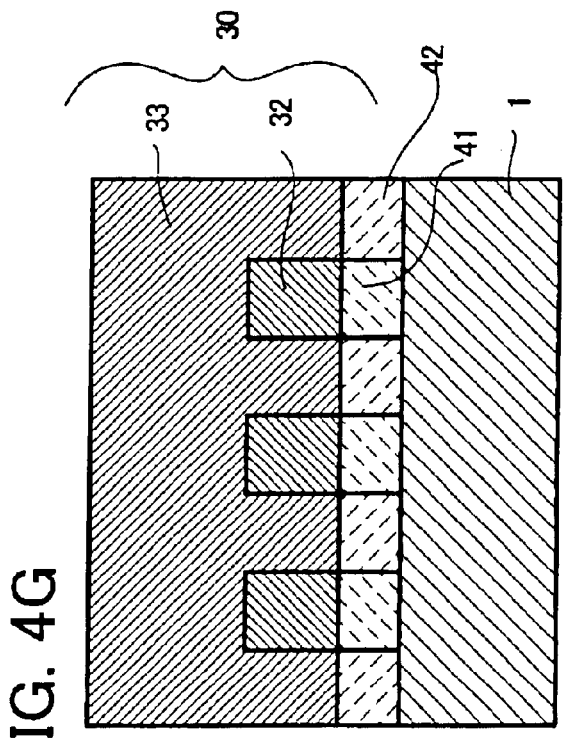

Through the aforementioned etching, mesas formed of the GaN layer 32 each having a width of 10 μm and a height of about 1.5 μm, and trenches of the sapphire substrate 1 each having a width of 10 μm and a depth of 0.2 μm were alternately formed (FIG. 2(e)). At this time, the {11-20} planes of the GaN layer 32 were served as the sidewalls of the trenches of a depth of 1.5 μm.

Subsequently, while the temperature of the sapphire substrate 1 was maintained at 1,150° C., $H_2$ (20 L/min), $NH_3$ (10 L/min), and TMG (2 μmol/min) were introduced, to thereby form a GaN layer 33 through lateral epitaxial growth performed while the sidewalls of the trenches of a depth of 1.5 μm; i.e., the {11-20} planes of the GaN layer 32, served as nuclei for crystal growth. At an initial stage, vertical epitaxial growth from the top surfaces of the mesas was suppressed (FIG. 2(f)). Lateral epitaxial growth was performed while the {11-20} planes primarily served as the growth fronts, whereby the trenches were filled, and the surface of the GaN layer 33 became flat. Thereafter, $H_2$ (20 L/min), $NH_3$ (10 L/min), and TMG (300 μmol/min) were introduced, to thereby further grow the GaN layer 33 until the overall thickness of the GaN layer 32 and the GaN layer 33 became 300 μm (FIG. 2(g)). Thereafter, a GaN substrate 30 including the GaN layer 32 and the GaN layer 33 was separated, through dicing, from the sapphire substrate 1 and the remaining portion of the GaN layer 31 (see FIG. 5(c)) at the boundary between the GaN substrate 30 and the remaining portion of the GaN layer 31 (FIG. 2(h)). The thus-produced GaN substrate 30 was found to contain virtually no threading dislocations.

[Second Embodiment]

FIGS. 3 and 4 show the steps of the present embodiment. A monocrystalline sapphire substrate 1 whose principal surface an a-plane was cleaned through organic cleaning and heat treatment. The temperature of the substrate 1 was lowered to 400° C., and $H_2$ (10 L/min), $NH_3$ (5 L/min), and TMA (20 μmol/min) were fed for about three minutes, to thereby form an AlN buffer layer 2 (thickness: about 40 nm) on the substrate 1. Subsequently, while the temperature of the sapphire substrate 1 was maintained at 1,000° C., $H_2$ (20 L/min), $NH_3$ (10 L/min), and TMG (300 μmol/min) were introduced, to thereby form a GaN layer 31 (thickness: about 1 μm).

By use of a hard bake resist mask, stripe-shaped trenches each having a width of 10 μm and a depth of about 1 μm were formed at intervals of 10 μm through selective dry etching employing reactive ion etching (RIE). As a result, mesas formed of the GaN layer 31 and the buffer layer 2 each having a width of 10 μm and a height of about 1 μm, and trenches each having a width of 10 μm and having the sapphire substrate 1 exposed at the bottom thereof were alternately formed (FIG. 3(a)). At this time, the {11-20} planes of the GaN layer 31 were served as the sidewalls of the trenches of a depth of 1 μm.

Subsequently, a silicon dioxide ($SiO_2$) film was uniformly formed through sputtering. Thereafter, a resist was applied onto the $SiO_2$ film; a portion of the resist that covered a necessary portion of the silicon dioxide film was remained through photolithography; and a portion of the silicon dioxide film that was not covered with the resist was subjected to wet etching, to thereby form a wafer having the structure shown in FIG. 3(b) and including masks 41.

Subsequently, while the temperature of the sapphire substrate 1 was maintained at 1,150° C, $H_2$ (20 L/min), $NH_3$ (10 L/min), and TMG (2 μmol/min) were introduced, to thereby form a GaN layer 32 through lateral epitaxial growth performed while the sidewalls of the trenches of a depth of 1 μm; i.e., the {11-20} planes of the GaN layer 31, served as nuclei for crystal growth. At an initial stage, vertical epitaxial growth from the top surfaces of the mesas was suppressed (FIG. 3(c)). Lateral epitaxial growth was performed while the {11-20} planes primarily served as the growth fronts, whereby the trenches were filled, and the surface of the GaN layer 32 became flat. The overall thickness of the GaN layer 31 and the GaN layer 32 was found to be about 1.5 μm (FIG. 3(d)).

Subsequently, by use of a hard bake resist mask, stripe-shaped trenches each having a width of 10 μm and a depth of about 1.5 μm were formed at intervals of 10 μm through selective dry etching employing reactive ion etching (RIE), whereby virtually the entirety of the GaN layer 31 and the buffer layer 2 were removed, together with the GaN layer 32 formed on the GaN layer 31. As a result, mesas formed of the GaN layer 32 each having a width of 10 μm and a height of about 1.5 μm, and trenches each having a width of 10 μm and having the sapphire substrate 1 exposed at the bottom thereof were alternately formed. At this time, the {11-20} planes of the GaN layer 32 were served as the sidewalls of the trenches of a depth of 1.5 μm. Subsequently, a silicon dioxide (SiO$_2$) film was uniformly formed through sputtering. Thereafter, a resist was applied onto the SiO$_2$ film; a portion of the resist that covered a necessary portion of the silicon dioxide film was caused to remain through photolithography; and a portion of the silicon dioxide film that was not covered with the resist was subjected to wet etching, to thereby form a wafer including SiO$_2$ masks 42 (FIG. 4 (e)). The aforementioned procedure of the second embodiment is similar to that of the first embodiment, and the thus-formed structure is schematically shown in FIG. 5. Specifically, FIG. 5(a) is a plan view corresponding to FIG. 3(b), and reference letter B of FIG. 5(a) denotes the SiO$_2$ masks 41 formed on the sapphire substrate 1. FIG. 5(b) is a plan view corresponding to FIG. 4(e), and reference letter A of FIG. 5(b) denotes the exposed SiO$_2$ masks 42 formed on the sapphire substrate 1. As shown in FIG. 5(b) (not illustrated in FIG. 4(e)), in consideration of workability, the GaN layer 31 is caused to remain on the periphery of the sapphire substrate 1.

Subsequently, while the temperature of the sapphire substrate 1 was maintained at 1,150° C., H$_2$ (20 L/min), NH$_3$ (10 L/min), and TMG (2 μmol/min) were introduced, to thereby form a GaN layer 33 through lateral epitaxial growth performed while the sidewalls of the trenches of a depth of 1.5 μm; i.e., the {11-20} planes of the GaN layer 32, served as nuclei for crystal growth. At an initial stage, vertical epitaxial growth from the top surfaces of the mesas was suppressed (FIG. 4(f)). Lateral epitaxial growth was performed while the {11-20} planes primarily served as the growth fronts, whereby the trenches were filled, and the surface of the GaN layer 33 became flat. Thereafter, H$_2$ (20 L/min), NH$_3$ (10 L/min), and TMG (300 μmol/min) were introduced, to thereby further grow the GaN layer 33 until the overall thickness of the GaN layer 32 and the GaN layer 33 became 300 μm (FIG. 4(g)). Subsequently, the SiO$_2$ masks 41 and 42 were removed through wet etching employing a hydrofluoric-acid-based etchant. Thereafter, a GaN substrate 30 including the GaN layer 32 and the GaN layer 33 was separated, through dicing, from the sapphire substrate 1 and the remaining portion of the GaN layer 31 (see FIG. 5(c)) at the boundary between the GaN substrate 30 and the remaining portion of the GaN layer 31 (FIG. 4(h)). The thus-produced GaN substrate 30 was found to contain virtually no threading dislocations.

[Third Embodiment]

Figure 6:
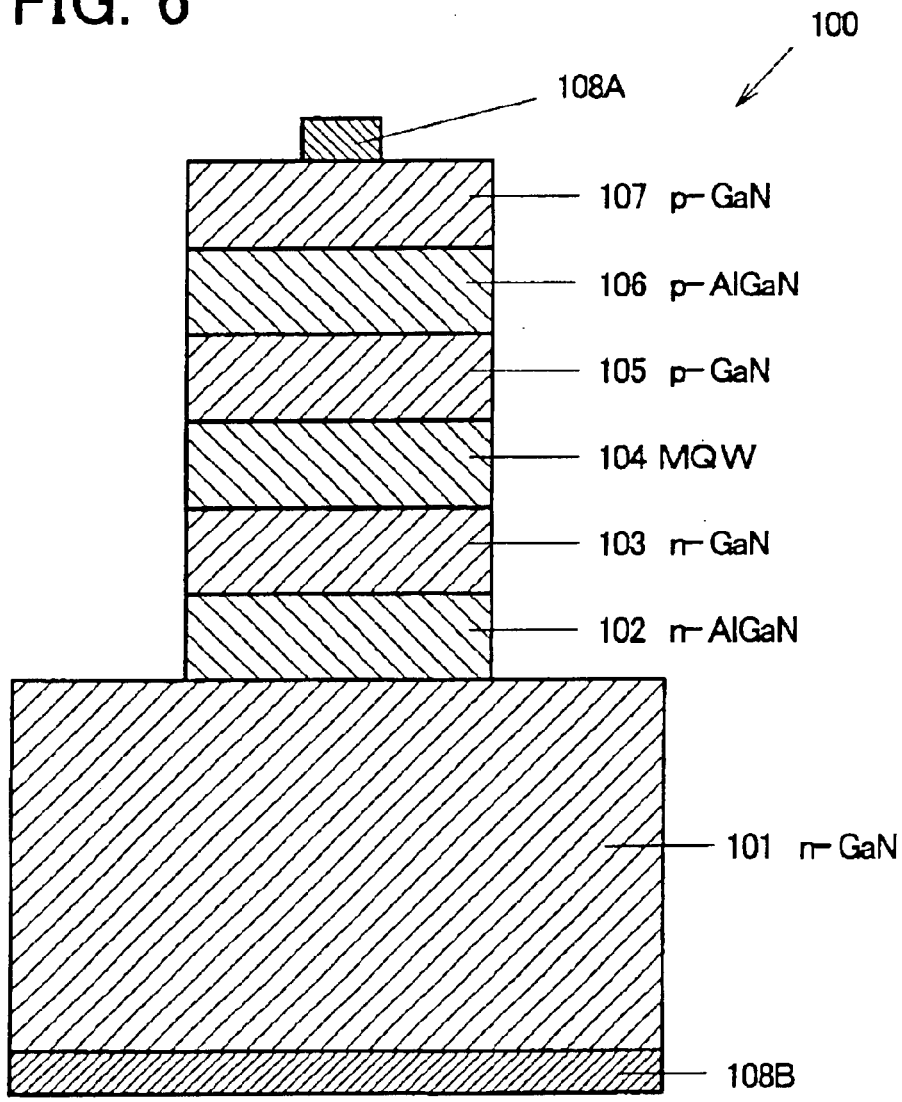
FIG. 6 is a cross-sectional view showing the structure of a Group III nitride compound semiconductor light-emitting device according to a third embodiment of the present invention.

In the present embodiment, the first embodiment was modified such that silane (SiH$_4$) was fed during formation of the GaN layers 32 and 33, to thereby produce an n-type GaN substrate 101, and the thus-produced substrate 101 was employed. On the n-type GaN substrate 101, a silicon (Si)doped n-Al$_{0.15}$Ga$_{0.85}$N layer 102 (thickness: 2 μm) was formed at a temperature of 1,150° C. through feeding of H$_2$ (10 L/min), NH$_3$ (10 L/min), TMG (100 mol/min), TMA (10 μmol/min), and silane (SiH$_4$) diluted with H$_2$ gas to 0.86 ppm (0.2 μmol/min). On the n-Al$_{0.15}$Ga$_{0.85}$N layer 102, a silicon (Si)-doped GaN n-guide layer 103, an MQW-structured light-emitting layer 104, a magnesium (Mg)-doped GaN p-guide layer 105, a magnesium (Mg)-doped Al$_{0.08}$Ga$_{0.92}$N p-cladding layer 106, and a magnesium (Mg)-doped GaN p-contact layer 107 were formed. Subsequently, an electrode 108A of gold (Au) was formed on the p-contact layer 107, and an electrode 108B of aluminum (Al) was formed on the back side of the n-type GaN substrate 101 (FIG. 6). A laser diode (LD) 100 was formed on the n-type GaN substrate 101 containing virtually no threading dislocations. The thus-formed laser diode (LD) 100 exhibited significant improvement of life time and light-emitting efficiency.

[Fourth Embodiment]

Figure 7:
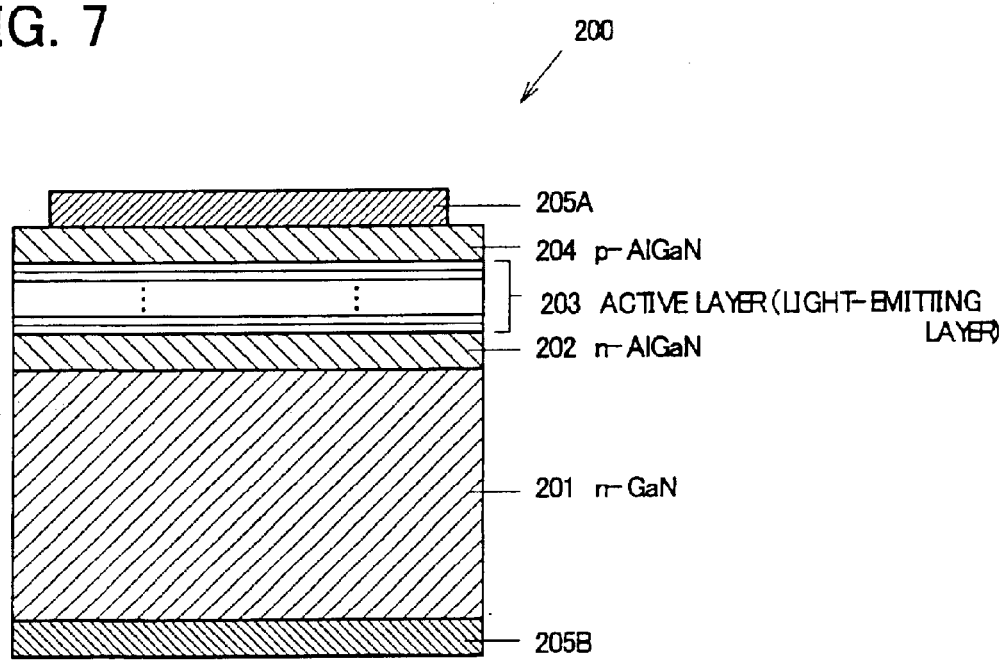
FIG. 7 is a cross-sectional view showing the structure of a Group III nitride compound semiconductor light-emitting device according to a fourth embodiment of the present invention.
Figure 9:
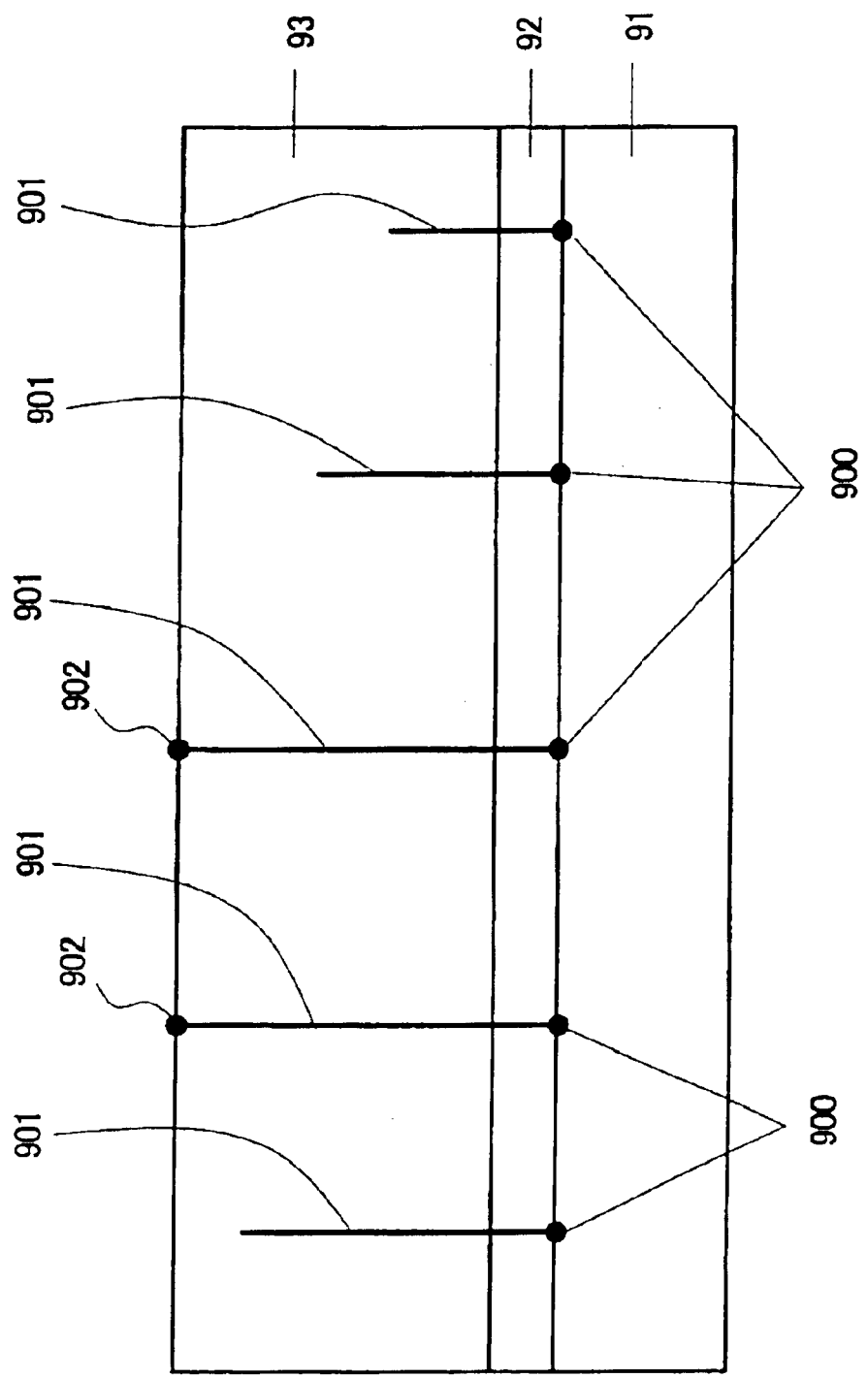
FIG. 9 is a cross-sectional view showing threading dislocations propagating in a Group III nitride compound semiconductor.

In the present embodiment, an n-type GaN substrate was employed. On an n-type GaN substrate 201, an n-Al$_{0.15}$Ga$_{0.85}$N layer 202, a light-emitting layer 203, and a magnesium (Mg)-doped Al$_{0.15}$Ga$_{0.85}$N p-cladding layer 204 were formed. Subsequently, an electrode 205A of gold (Au) was formed on the p-cladding layer 204, and an electrode 205B of aluminum (Al) was formed on the back side of the GaN substrate 201 (FIG. 7). The thus-formed light-emitting diode (LED) 200 exhibited significant improvement of life time and light-emitting efficiency.

[Modification of Etching]

FIG. 8 shows an example in which island-like mesas are formed by means of three groups of {11-20} planes. To facilitate understanding, the schematic view of FIG. 8(a) includes a peripheral region formed by means of three groups of {11-20} planes. In actuality, tens of millions of island-like mesas may be formed per wafer. In FIG. 8(a), the area of the bottoms of the trenches B is three times the area of the top surfaces of the island-like mesas. In FIG. 8(b), the area of the bottoms of the trenches B is eight times the area of the top surfaces of the island-like mesas.

What is claimed is:

1. A method for fabricating a Group-III nitride compound semiconductor substrate through epitaxial growth of a Group-III nitride compound semiconductor layer on a substrate base, and removal of the substrate base, said method comprising:

forming an underlying layer on a substrate base, the underlying layer comprising at least one Group-III nitride compound semiconductor layer, and the uppermost layer of the underlying layer being a first Group-III nitride compound semiconductor layer;

forming a first trench/mesa structure in which at least a portion of the first Group-III nitride compound semiconductor layer, at least a portion of the underlying layer and at least a portion of the surface of the substrate base are removed through etching so as to form an island-like structure, thereby providing said first trench/mesa structure including mesas formed on the underlying layer and trenches whose bottoms sink into the surface of the substrate base;

performing a first lateral epitaxial growth in which a second Group-III nitride compound semiconductor layer is epitaxially grown, vertically and laterally, with top surfaces of the mesas and sidewalls of the trenches serving as nuclei for crystal growth, thereby filling upper portions of the trenches and covering the mesas;

forming a second trench/mesa structure in which the entire underlying layer that has not undergone etching in the formation of the first trench/mesa structure, excepting a peripheral portion of the underlying layer, is removed by etching, a portion of the second Group-III nitride compound semiconductor layer formed on the underlying layer and at least a portion of the surface of the substrate base are also removed by etching, so as to provide said second trench/mesa structure including mesas formed on the remaining second Group-III nitride compound semiconductor layer and trenches whose bottoms sink into the surface of the substrate base;

performing a second lateral epitaxial growth in which a third Group-III nitride compound semiconductor layer is epitaxially grown, vertically and laterally, with top surfaces of the mesas and sidewalls of the trenches in the second trench/mesa structure serving as nuclei for crystal growth, thereby filling upper portions of the trenches and covering the mesas in the second trench/mesa structure; and removing the substrate base and the remaining underlying layer which has not been removed in the formation of the second trench/mesa structure, to thereby produce a substrate comprising the remaining second Group-III nitride compound semiconductor layer and the third Group-III nitride compound semiconductor layer.

2. A method for fabricating a Group-III nitride compound semiconductor substrate according to claim 1, wherein virtually all the sidewalls of the trenches in the first and second trench/mesa structures are a {11-20} plane.

3. A method for fabricating a Group-III nitride compound semiconductor substrate according to claim 2, wherein the first Group-III nitride compound semiconductor layer and the second Group-III nitride compound semiconductor layer have a same composition.

4. A method for fabricating a Group-III nitride compound semiconductor substrate according to claim 2, wherein the second Group-III nitride compound semiconductor layer and the third Group-III nitride compound semiconductor layer have a same composition.

5. A method for fabricating a Group-III nitride compound semiconductor substrate according to claim 1, wherein the first Group-III nitride compound semiconductor layer and the second Group-III nitride compound semiconductor layer have a same composition.

6. A method for fabricating a Group-III nitride compound semiconductor substrate according to claim 5, wherein the second Group-III nitride compound semiconductor layer and the third Group-III nitride compound semiconductor layer have a same composition.

7. A method for fabricating a Group-III nitride compound semiconductor substrate according to claim 1, wherein the second Group-III nitride compound semiconductor layer and the third Group-III nitride compound semiconductor layer have a same composition.

8. A Group-III nitride compound semiconductor device, which is formed on a Group-III nitride compound semiconductor substrate produced through a method for fabricating a Group-III nitride compound semiconductor substrate as recited in claim 1.

9. A Group-III nitride compound semiconductor light-emitting device, which is produced by laminating a different Group-III nitride compound semiconductor layer on a Group-III nitride compound semiconductor substrate produced by a method for fabricating a Group-III nitride compound semiconductor substrate as recited in claim 1.

10. A method for fabricating a Group-III nitride compound semiconductor substrate according to claim 1, wherein said island-like structure includes one of a dot, a stripe, and a grid shape.

11. A method for fabricating a Group-III nitride compound semiconductor substrate comprising epitaxial growth of a Group-III nitride compound semiconductor layer on a substrate base, and removal of the substrate base, said method comprising:

forming an underlying layer on a substrate base, the underlying layer comprising at least one Group-III nitride compound semiconductor layer, and the uppermost layer of the underlying layer being a first Group-III nitride compound semiconductor layer;

forming a first trench/mesa structure in which a portion of the first Group-III nitride compound semiconductor layer and a portion of the underlying layer are etched so as to form an island-like structure, thereby providing said first trench/mesa structure, such that the substrate base is exposed so as to provide the bottoms of trenches in said first trench/mesa structure;

forming a first mask structure in which first masks are formed at the bottoms of the trenches in the first trench/mesa structure, such that the upper surfaces of the first masks are positioned below the top surface of the uppermost layer of the underlying layer;

performing a first lateral epitaxial growth in which a second Group-III nitride compound semiconductor layer is epitaxially grown, vertically and laterally, with top surfaces of mesas and sidewalls of the trenches serving as nuclei for crystal growth, thereby filling spaces above the first masks and covering the mesas in said first trench/mesa structure;

forming a second trench/mesa structure in which substantially the entire underlying layer that has not undergone etching in the formation of the first trench/mesa structure and a portion of the second Group III nitride compound semiconductor layer formed on the underlying layer are removed by etching, so as to provide said second trench/mesa structure including mesas formed on the remaining second Group-III nitride compound semiconductor layer and trenches such that the substrate base is exposed so as to provide the bottoms of the trenches of the second trench/mesa structure;

forming a second mask structure in which second masks are formed at the bottoms of the trenches in the second trench/mesa structure, such that the upper surfaces of the second masks are positioned below the top surface of the second Group-III nitride compound semiconductor layer;

performing a second lateral epitaxial growth in which a third Group-III nitride compound semiconductor layer is epitaxially grown, vertically and laterally, with top surfaces of the mesas and sidewalls of the trenches of the second trench/mesa structure serving as nuclei for crystal growth, thereby filling spaces above the second masks and covering the mesas of the second trench/mesa structure;

removing the first and second masks by wet etching; and removing the substrate base, to thereby produce a substrate comprising the remaining second Group-III nitride compound semiconductor layer and the third Group-III nitride compound semiconductor layer.

12. A method for fabricating a Group-III nitride compound semiconductor substrate according to claim 11, wherein the masks comprise a substance capable of impeding epitaxial growth of a Group-III nitride compound semiconductor layer on the masks.

13. A method for fabricating a Group-III nitride compound semiconductor substrate according to claim 12, wherein virtually all the sidewalls of the trenches in the first and second trench/mesa structures area {11-20} plane.

14. A method for fabricating a Group-III nitride compound semiconductor substrate according to claim 12, wherein the first Group-III nitride compound semiconductor layer and the second Group-III nitride compound semiconductor layer have a same composition.

15. A method for fabricating a Group-III nitride compound semiconductor substrate according to claim 12, wherein the second Group-III nitride compound semiconductor layer and the third Group-III nitride compound semiconductor layer have a same composition.

16. A Group-III nitride compound semiconductor device, which is formed on a Group-III nitride compound semiconductor substrate produced through a method for fabricating a Group-III nitride compound semiconductor substrate as recited in claim 12.

17. A method for fabricating a Group-III nitride compound semiconductor substrate according to claim 11, wherein virtually all the sidewalls of the trenches in the first and second trench/mesa structures are a {11-20} plane.

18. A method for fabricating a Group-III nitride compound semiconductor substrate according to claim 11, wherein the first Group-III nitride compound semiconductor layer and the second Group-III nitride compound semiconductor layer have a same composition.

19. A method for fabricating a Group-III nitride compound semiconductor substrate according to claim 11, wherein the second Group-III nitride compound semiconductor layer and the third Group-III nitride compound semiconductor layer have a same composition.

20. A Group-III nitride compound semiconductor device, which is formed on a Group-III nitride compound semiconductor substrate produced through a method for fabricating a Group-III nitride compound semiconductor substrate as recited in claim 11.

21. A Group-III nitride compound semiconductor light-emitting device, which is produced by laminating a different Group-III nitride compound semiconductor layer on a Group-III nitride compound semiconductor substrate produced by a method for fabricating a Group-III nitride compound semiconductor substrate as recited in claim 11.

22. A method for fabricating a Group-III nitride compound semiconductor substrate according to claim 11, wherein said island-like structure includes one of a dot, a stripe, and a grid shape.

* * * * *